United States Patent
Seddon

(10) Patent No.: US 12,341,069 B2
(45) Date of Patent: *Jun. 24, 2025

(54) BACKSIDE METAL PATTERNING DIE SINGULATION SYSTEM AND RELATED METHODS

(71) Applicant: SEMICONDUCTOR COMPONENTS INDUSTRIES, LLC, Scottsdale, AZ (US)

(72) Inventor: Michael J. Seddon, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/443,562

(22) Filed: Feb. 16, 2024

(65) Prior Publication Data

US 2024/0186182 A1 Jun. 6, 2024

Related U.S. Application Data

(63) Continuation of application No. 18/153,133, filed on Jan. 11, 2023, now Pat. No. 11,929,285, which is a
(Continued)

(51) Int. Cl.
*H01L 21/78* (2006.01)
*H01L 21/027* (2006.01)
(Continued)

(52) U.S. Cl.
CPC .......... *H01L 21/78* (2013.01); *H01L 21/0274* (2013.01); *H01L 21/268* (2013.01);
(Continued)

(58) Field of Classification Search
CPC ... H01L 21/78; H01L 21/0274; H01L 21/268; H01L 21/32; H01L 21/32051;
(Continued)

(56) References Cited

U.S. PATENT DOCUMENTS 8,450,188 B1 5/2013 Lindsey, Jr.
9,640,497 B1 5/2017 Lin et al.
(Continued)

OTHER PUBLICATIONS

Zhao, D., et al. "Influence of SIC chip thickness on the power cycling capability of Power Electronics Assemblies—a comprehensive numerical study." Microelectronics Reliability, vol. 150, Nov. 2023, p. 115091, https://doi.org/10.1016/j.microrel.2023.115091. (Year: 2023).*

(Continued)

*Primary Examiner* — J. E. Schoenholtz
(74) *Attorney, Agent, or Firm* — IPTechLaw LLC

(57) ABSTRACT

Implementations of methods of singulating a plurality of die included in a substrate may include forming a plurality of die on a first side of a substrate, forming a backside metal layer on a second side of a substrate, applying a photoresist layer over the backside metal layer, patterning the photoresist layer along a die street of the substrate, and etching through the backside metal layer located in the die street of the substrate. The substrate may be exposed through the etch. The method may also include singulating the plurality of die included in the substrate through removing a substrate material in the die street.

20 Claims, 7 Drawing Sheets

Related U.S. Application Data continuation of application No. 17/216,167, filed on Mar. 29, 2021, now Pat. No. 11,581,223, which is a continuation of application No. 16/505,878, filed on Jul. 9, 2019, now Pat. No. 10,964,596.

(60) Provisional application No. 62/796,659, filed on Jan. 25, 2019.

(51) Int. Cl.
  *H01L 21/268* (2006.01)
  *H01L 21/32* (2006.01)
  *H01L 21/3205* (2006.01)
  *H01L 21/3213* (2006.01)
  *H01L 21/66* (2006.01)
  *H01L 23/544* (2006.01)

(52) U.S. Cl.
  CPC ........ *H01L 21/32* (2013.01); *H01L 21/32051* (2013.01); *H01L 21/32131* (2013.01); *H01L 22/20* (2013.01); *H01L 23/544* (2013.01); *H01L 2223/5446* (2013.01)

(58) Field of Classification Search
  CPC . H01L 21/32131; H01L 22/20; H01L 23/544; H01L 2223/5446; H01L 2223/54426; H01L 2223/54453
  See application file for complete search history.

(56) References Cited

U.S. PATENT DOCUMENTS

| | | | |
|---|---|---|---|
| 10,964,596 B2 | 3/2021 | Seddon | |
| 11,581,223 B2 | 2/2023 | Seddon | |
| 11,929,285 B2* | 3/2024 | Seddon | ............ H01L 21/32051 |
| 2008/0242052 A1* | 10/2008 | Feng | .................. H01L 21/3043 |
| | | | 438/459 |
| 2013/0175671 A1 | 7/2013 | Renaud et al. | |
| 2014/0094018 A1 | 4/2014 | Falvo et al. | |
| 2015/0069591 A1 | 3/2015 | Fischer et al. | |
| 2015/0108612 A1* | 4/2015 | Numaguchi | ...... H01L 21/32139 |
| | | | 257/620 |
| 2015/0145149 A1 | 5/2015 | Wachter et al. | |
| 2017/0110329 A1* | 4/2017 | Carmelo | ................. H01L 24/06 |
| 2017/0294391 A1 | 10/2017 | Lin et al. | |
| 2018/0012857 A1* | 1/2018 | Lin | ....................... H01L 21/561 |
| 2019/0013242 A1 | 1/2019 | Molla et al. | |
| 2019/0171120 A1 | 6/2019 | Sanchez-Fabres Cobaleda et al. | |
| 2019/0326255 A1 | 10/2019 | Olson et al. | |
| 2020/0152545 A1 | 5/2020 | Kurokawa et al. | |
| 2020/0243391 A1 | 7/2020 | Seddon | |
| 2021/0060924 A1 | 3/2021 | Utsumi | |
| 2021/0328138 A1 | 10/2021 | Aggarwal et al. | |

OTHER PUBLICATIONS

Hsieh, Chi-Hsiang, et al. "Recent advances in silicon carbide chemical mechanical polishing technologies." Micromachines, vol. 13, No. 10, Oct. 16, 2022, p. 1752, https://doi.org/10.3390/mi13101752. (Year: 2022).*

Gupta, S. et al., Ultra-thin Chips for High-performance Flexible Electronics. npj Flex Electron 2, 8 (2018). https://doi.org/10.1038/s41528-018-0021-5 . (Year: 2018).

Tong, G. et al., Flexible Hybrid Electronics: Review and Challenges, 2018 IEEE International Symposium on Circuits and Systems (ISCAS), Florence, 2018, pp. 1-5, doi: 10.1109/ISCAS.2018.8351806. (Year: 2018).

Marinov, V., Back-End Chip Technology for Flexible Hybrid Electronics: Challenges and Solutions, Flexible Electronics and Material Track, ETCMOS 2016, Montreal May 25-27, 2016. (Year: 2016).

Lei, W-S et al., Die Singulation Technologies for Advanced Packaging: A Critical Review, Journal of Vacuum Science & Technology B, Nanotechnology and Microelectronics: Materials, Processing, Measurement, and Phenomena, Jul. 2012, vol. 30(4), p. 040801. (Year: 2012).

Definition of 'in' downloaded from URL <https://www.merriam-webster.com/dictionary/in> on Aug. 13, 2023. (Year: 2023).

Definition of 'on' downloaded from URL <https://www.merriam-webster.com/dictionary/on> on Aug. 13, 2023. (Year: 2023).

* cited by examiner

BACKSIDE METAL PATTERNING DIE SINGULATION SYSTEM AND RELATED METHODS

CROSS REFERENCE TO RELATED APPLICATIONS

This application claims the benefit of the filing date of U.S. Provisional Patent Application 62/796,659, entitled "BACKSIDE METAL PATTERNING DIE SINGULATION SYSTEM AND RELATED METHODS" to Seddon, which was filed on Jan. 25, 2019, the disclosure of which is hereby incorporated entirely herein by reference.

This application is a continuation application of the earlier U.S. Utility Patent Application to Seddon entitled "BACKSIDE METAL PATTERNING DIE SINGULATION SYSTEM AND RELATED METHODS," application Ser. No. 18/153,133, filed Jan. 11, 2023, now pending, which application is a continuation application of the earlier U.S. Utility Patent Application to Seddon entitled "BACKSIDE METAL PATTERNING DIE SINGULATION SYSTEM AND RELATED METHODS," now issued as U.S. Pat. No. 11,581,223, which application is a continuation application of the earlier U.S. Utility Patent Application to Seddon entitled "BACKSIDE METAL PATTERNING DIE SINGULATION SYSTEM AND RELATED METHODS," now issued as U.S. Pat. No. 10,964,596, the disclosures of each of which are hereby incorporated entirely herein by reference.

BACKGROUND

1. Technical Field

Aspects of this document relate generally to die singulation systems and methods. More specific implementations involve methods of singulating semiconductor die from a thinned substrate.

2. Background

Semiconductor devices include integrated circuits found in common electrical and electronic devices, such as phones, desktops, tablets, other computing devices, and other electronic devices. The devices are separated through singulating a wafer of semiconducting material into a plurality of semiconductor die. Various layers may be coupled to the front side and/or the backside of the wafer. Upon singulation, the die can be mounted on a package and electrically integrated with the package which may then be used in the electrical or electronic device.

SUMMARY

Implementations of methods of singulating a plurality of die included in a substrate may include forming a plurality of die on a first side of a substrate, forming a backside metal layer on a second side of a substrate, applying a photoresist layer over the backside metal layer, patterning the photoresist layer along a die street of the substrate, and etching through the backside metal layer located in the die street of the substrate. The substrate may be exposed through the etch. The method may also include singulating the plurality of die included in the substrate through removing a substrate material in the die street.

Implementations of methods of singulating a plurality of die included in a substrate may include one, all, or any of the following:

The method may include thinning the second side of the substrate and the substrate may be thinned to less than 50 micrometers thick.

The method may include thinning the second side of the substrate and the substrate may be thinned to less than 30 micrometers thick.

The backside metal layer may be 10 micrometers thick.

Patterning the photoresist layer may include exposing the photoresist layer and developing the photoresist layer.

Removing substrate material in the die street may include using either a laser beam or a saw blade.

The method may include remote plasma healing a plurality of sidewalls of the plurality of die after singulating the die.

Removing substrate material in the die street may include plasma etching.

Singulating the plurality of die included in the substrate through plasma etching may include removing a portion of the substrate material of the substrate having a width less than a width of the die street.

Implementations of methods of singulating a plurality of die included in a substrate may include forming a plurality of die on a first side of a substrate, forming a seed layer on a second side of a substrate opposite the first side of the substrate, applying a photoresist layer over the seed layer, patterning the photoresist layer, forming a backside metal layer over the seed layer, removing the photoresist layer, and singulating the plurality of die included in the substrate through removing a substrate material in the die street and through removing a seed layer material in the die street.

Implementations of methods of singulating a plurality of die included in a substrate may include one, all, or any of the following:

The seed layer may include titanium.

The backside metal layer may include copper.

Removing substrate material in the die street may include plasma etching.

Removing substrate material in the die street and removing seed layer material in the die street may include using either a laser beam or a saw blade.

The method may include thinning the second side of the substrate to a thickness less than 30 micrometers.

The method may include aligning the substrate from a backside of a substrate.

Implementations of methods of singulating a plurality of die included in a substrate may include forming a plurality of die on a first side of a substrate, thinning a second side of a substrate, forming a seed layer on a second side of a substrate opposite the first side of the substrate, applying a photoresist layer over the seed layer, patterning the photoresist layer, forming a backside metal layer over the seed layer, removing the photoresist layer, and singulating the plurality of die included in the substrate through removing substrate material in the die street and through removing seed layer material in the die street using either a laser beam and a saw blade.

Implementations of methods of singulating a plurality of die included in a substrate may include one, all, or any of the following:

The method may include remote plasma healing a sidewall of the die.

The backside metal layer may be 10 micrometers thick.

The substrate may be thinned to less than 50 micrometers thick.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended die singulation systems and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such die singulation systems and related methods, and implementing components and methods, consistent with the intended operation and methods.

Figure 1:
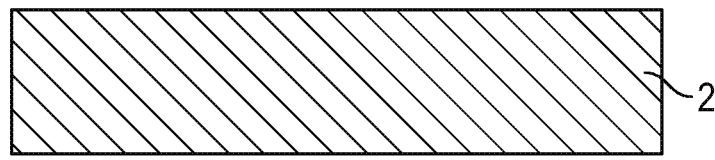
FIG. 1 is a cross sectional side view of a portion of a substrate.

Referring to FIG. 1, a cross sectional side view of a portion of a substrate 2 is illustrated. The term "substrate" refers to a semiconductor substrate as a semiconductor substrate is a common type of substrate, however, "substrate" is not an exclusive term that is used to refer to all semiconductor substrate types. Similarly, the term "substrate," may refer to a wafer as a wafer is a common type of substrate, however, "substrate" is not an exclusive term that is used to refer to all wafers. The various semiconductor substrate types disclosed in this document that may be utilized in various implementations may be, by non-limiting example, round, rounded, square, rectangular, or any other closed shape. In various implementations, the substrate 2 may include a substrate material such as, by non-limiting example, single crystal silicon, silicon dioxide, glass, gallium arsenide, sapphire, ruby, silicon-on-insulator, silicon carbide, polycrystalline or amorphous forms of any of the foregoing, and any other substrate material useful for constructing semiconductor devices. In particular implementations, the substrate may be a silicon-on-insulator substrate.

Figure 2:
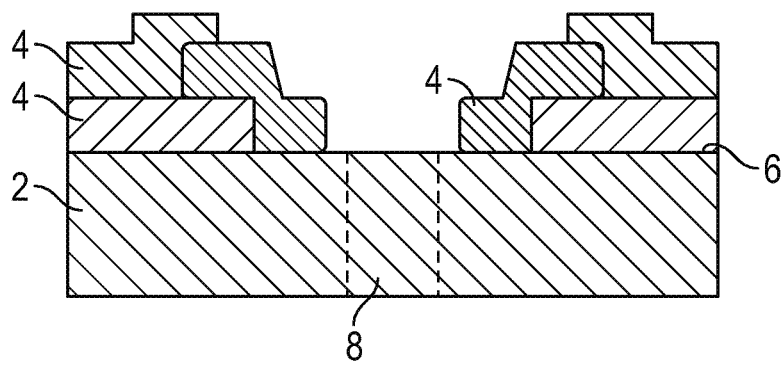
FIG. 2 is a cross sectional side view of a plurality of layers coupled to a first side of the substrate of FIG. 1.

Referring to FIG. 2, a cross sectional side view of a plurality of layers coupled to a first side of the substrate of FIG. 1 is illustrated. In various implementations, before singulating a plurality of die from the substrate 2, the method of forming a plurality of die may include forming a plurality of die on the substrate. This may include forming a plurality of layers 4 on a first side 6 the substrate 2. As illustrated by FIG. 2, the plurality of layers 4 may be patterned, and in various implementations, may be patterned (or otherwise removed) to not be over a die street 8 in the substrate 2. The plurality of layers may include, by non-limiting example, one or more metal layers, one or more passivation layers, any other layer, and any combination thereof. In various implementations passivation layers may include, by non-limiting example, silicon nitride, oxides, metal electrical test structures, electrical test pads, silicon dioxide, polyimides, metal pads, residual underbump metallization (UBM), any combination thereof, and any other layer or material capable of facilitating electrical or thermal connection between the one or more semiconductor die and/or protecting the one or more semiconductor die from contaminants. In various implementations, the plurality of die may include power semiconductor devices, such as, by non-limiting example, a MOSFET, an IGBT, or any other power semiconductor device. In other implementations, the plurality of die may include non-power semiconductor devices.

Figure 3:
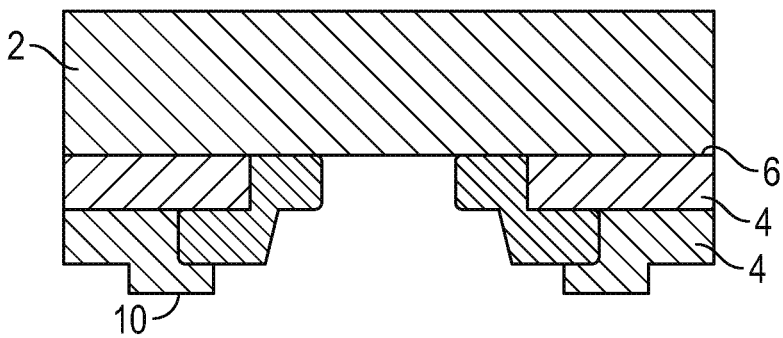
FIG. 3 is a view of the substrate and plurality of layers of FIG. 2 in a flipped orientation.
Figure 4:
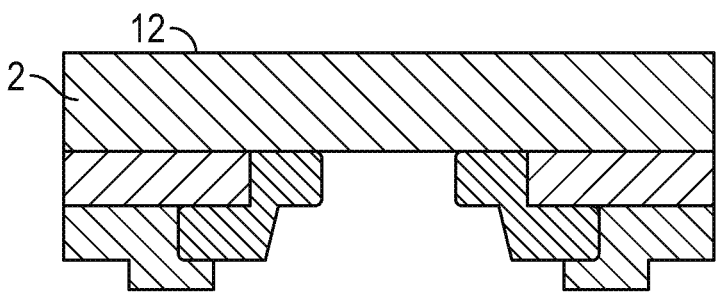
FIG. 4 is a view of the substrate and plurality of layers of FIG. 3 with the substrate thinned.

Referring to FIG. 3, a view of the substrate and plurality of layers of FIG. 2 in a flipped orientation is illustrated. The method of forming and singulating a plurality of die includes flipping the substrate and, though not illustrated, in various implementations, the method may include applying a tape to a first side 10 of the plurality of layers 4. Such a tape may be a backgrind tape in various implementations. Referring to FIG. 4, a view of substrate and plurality of layers of FIG. 3 with the substrate thinned is illustrated. In various implementations, the method of forming and singulating a plurality of die may include thinning the second side 12 of the substrate 2. In various implementations, the substrate 2 may be thinned to a thickness less than 50 micrometers (μm). In other implementations, the substrate 2 may be thinned to a thickness less than 30 μm. In still other implementations, the substrate 2 may be thinned to a thickness less than 100 μm, more than 100 μm, and in other various implementations, the substrate 2 may not be thinned. In particular implementations, the substrate 2 may be thinned to a thickness of about 25 μm, and in other particular implementations, the substrate may be thinned to a thickness of about 75 μm. The substrate 2 may be thinned through backgrinding, etching, or any other thinning technique. In particular implementations, the substrate is thinned using a backgrinding process marketed under the trade name TAIKO by DISCO of Tokyo, Japan to form an edge ring used to support the thinned substrate.

Figure 5:
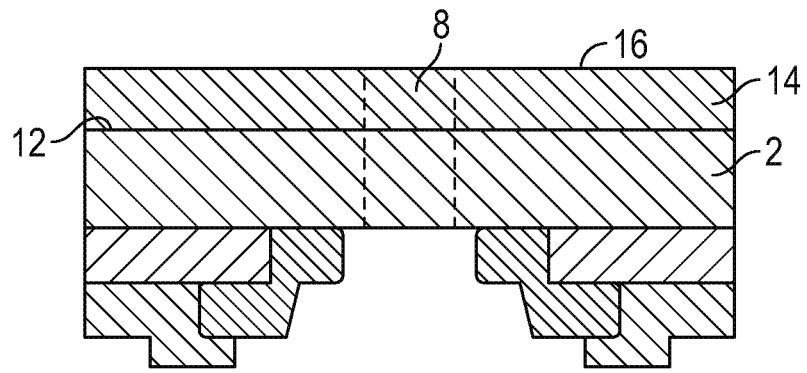
FIG. 5 is a view of the thinned substrate and plurality of layers of FIG. 4 with a backside metal layer coupled to the second side of the substrate.

Referring to FIG. 5, a view of thinned substrate and plurality of layers of FIG. 4 with a backside metal layer coupled to the second side of the substrate is illustrated. The method of forming a plurality of die and singulating the plurality of die includes forming a backside metal layer 14 on the second side 12 of the substrate 2. In particular implementations, the backside metal layer 14 may be copper or a copper alloy. In other implementations, the backside metal layer may include any other type of metal, alloy thereof, or combination thereof. In various implementations, the backside metal layer 14 may be about 10 μm thick. In other implementations, the backside metal layer may be more or less thick than 10 μm, and in particular implementations, the backside metal layer 14 may be about 15 μm thick. The backside metal layer 14 may be evaporated onto the substrate 2, however, in other implementations (including implementations having thicker substrates and/or thicker backside metal layers), the backside metal layer 14 may be plated onto the substrate 2 or formed on the substrate using another technique. In various implementations, the backside metal layer 14 may be formed over the entire second side 12 of the substrate 2. In such implementations, the backside metal layer 14 may strengthen the substrate 2.

Figure 6:
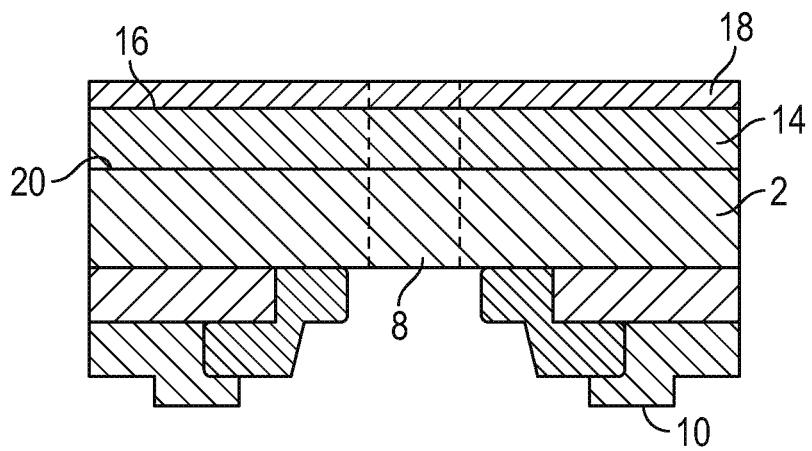
FIG. 6 is a view of a photoresist layer formed over the backside metal layer of FIG. 4.

Referring to FIG. 6, a view of a photoresist layer formed over the backside metal layer of FIG. 4 is illustrated. The method of forming a plurality of die and singulating the plurality of die may include applying a photoresist layer 18 over the backside metal layer 14, and in various implementations, over the entire second side 16 of the backside metal layer 14. In various implementations, the photoresist layer 18 may be directly coupled to the second side 16 (opposite the first side 20) of the backside metal layer 14. In various implementations, the method may include applying the photoresist layer 18 through spin coating or spraying the photoresist layer 18 onto the backside metal layer 14. In various implementations, the photoresist layer 18 may be about 1 μm thick, however, in other implementations the photoresist layer may be less than or more than 1 μm thick.

Figure 19:
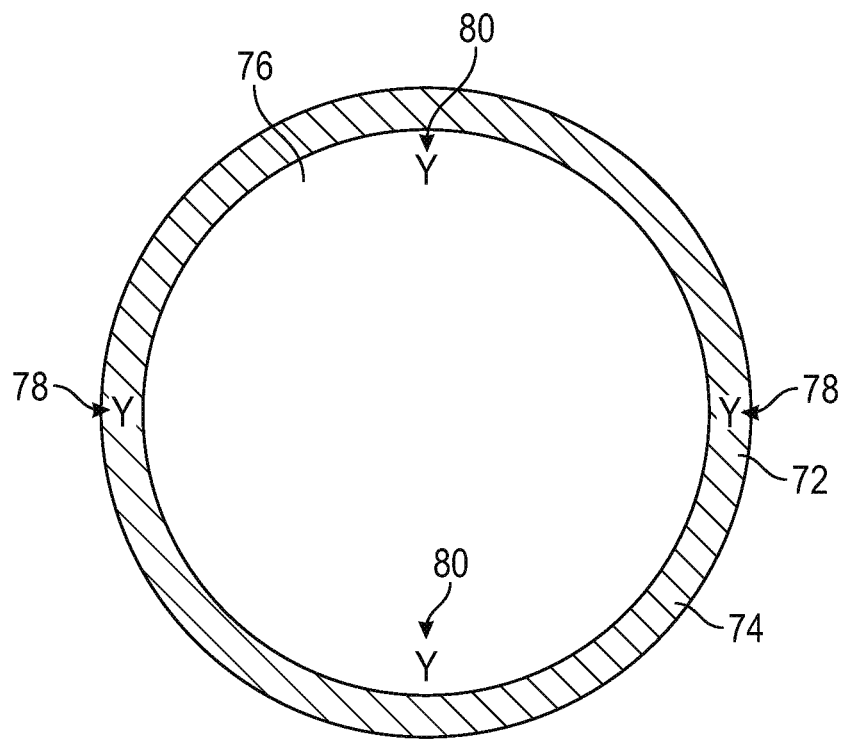
FIG. 19 is a top view of a substrate having an edge ring.
Figure 20:
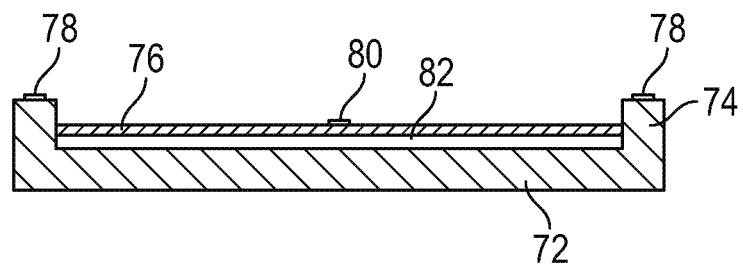
FIG. 20 is a cross-sectional side view of the substrate of FIG. 19.

Prior to patterning the photoresist layer 18, the method of singulating the plurality of die in the substrate may include aligning the substrate. In various implementations, the method may include aligning the substrate from the first side (which may be the front side, or bottom side as oriented in FIG. 6) using optics or a camera. In such implementations, the optics or camera may be placed below the substrate and may detect a plurality of alignment features formed on or within the substrate. In various implementations, the alignment features may be formed on or within the die street 8 of the substrate. In implementations having tape coupled to the first side 10 of the plurality of layers, the optics or camera may be configured to detect the plurality of alignment features through the tape. In a particular implementation, the substrate may be aligned using an infrared (IR) camera and IR alignment features. In other implementations, the substrate may be aligned from the backside, or second side 12 of the substrate. In such implementations, alignment features may be placed on the photoresist layer 18 covering the backside metal layer 14. Such features may be placed according to corresponding alignment features on the front side of the substrate. In other implementations where the substrate includes a ring around the perimeter after thinning the substrate, the method of aligning the substrate may include placing alignment features in the periphery of the substrate and grinding down the perimeter ring. The substrate may then be aligned from the backside, or second side 12 of the substrate by using the alignment features along the outer edge of the device. Such an alignment method may include using IR spectroscopy. Referring to FIG. 19, a top view of a substrate 72 having an edge ring 74 is illustrated. Referring to FIG. 20, a cross-sectional side view of the substrate 72 is illustrated. The edge ring 74 may include alignment features 78. In various implementations, alignment features 80 may be placed on the photoresist layer 76 coupled over the substrate 72. In various implementations, the photoresist layer 76 may be formed on a metal layer 82.

Figure 7:
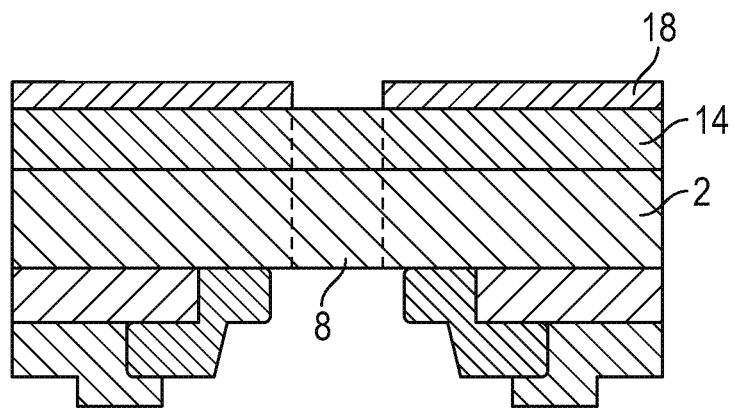
FIG. 7 is a view of the photoresist layer of FIG. 6 after patterning the photoresist layer.

Referring to FIG. 7, a view of the photoresist layer of FIG. 6 after patterning the photoresist layer is illustrated. The method of singulating a plurality of die from the substrate 2 includes patterning the photoresist layer 18 along the die street 8 of the substrate. The photoresist layer may be made of a positive or negative photosensitive material (positive or negative photoresist). In various implementations, patterning the photoresist layer 18 may include exposing a positive photoresist along the die streets 8 of the substrate 2. In other implementations, patterning the photoresist layer 18 may include exposing the portions of the photoresist layer not along a die street in a negative photoresist. In various implementations, a single mask including the pattern of all of the die streets 8 may be used in exposing the positive photoresist layer. In other implementations, multiple masks may be used to expose the positive photoresist layer along the die streets 8 or along the portions of the photoresist layer not over the die streets 8. In such implementations, the substrate may be stepped or scanned below the pattern to duplicate the pattern across the substrate. Patterning the photoresist layer 18 also includes developing the photoresist layer 18 to remove the portions of the photoresist layer over the die streets 8. In various implementations where a plasma etch is used to singulate the plurality of die, as disclosed later herein, the patterns of the die streets formed in the photoresist layer may include a variety of shapes, including, by non-limiting example, quadrilateral, rectangular, rounded rectangular, circular, ovate, triangular, pentagonal, hexagonal, heptagonal, octagonal, or any other closed shape. Because plasma etching may be used to singulated the plurality of die, the die streets need not be straight perpendicularly aligned lines extending across the entire substrate.

Figure 8:
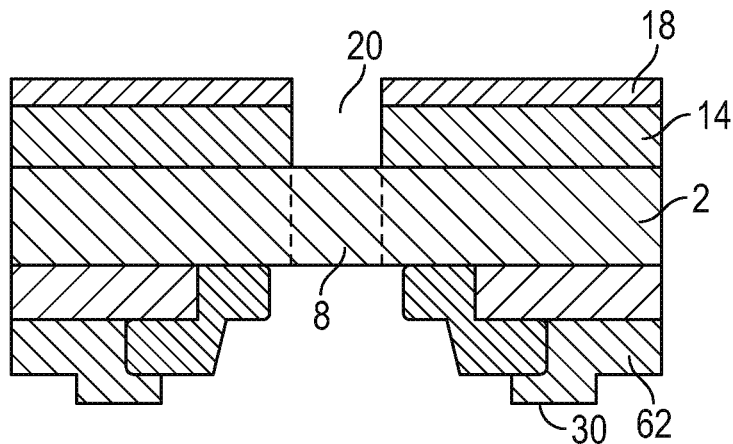
FIG. 8 is a view of the backside metal layer of FIG. 7 having a groove formed entirely therethrough.

Referring to FIG. 8, a view of the backside metal layer of FIG. 7 having a groove formed entirely therethrough is illustrated. In various implementations, the method of singulating a plurality of die may include etching through the backside metal layer 14 located in the die street 8 of the substrate 2. Etching, as illustrated by FIG. 8, may form a groove 20 through the backside metal layer 14 and may expose the substrate 2 through the etch. In various implementations, the etch applied within the groove 24 may be a wet etch and may be sprayed into the groove 24. In other implementations the wet etch may be applied using a method aside from spraying. In various implementations, though not illustrated, tape or other layer may be applied to the front side, or outer surface 30 of the plurality of layers 4. The tape or other layer may protect the pads 62 of the plurality of die from the etch. Because of the precision of patterning the photoresist layer 18, in various implementations, the groove 20 formed within the die street 8 may also precisely (at least to the level of precision of the patterning of the photoresist layer) correspond to the die street 8. In turn, more narrow die streets than those is in saw singulation may be utilized as patterning of the photoresist layer 18 more closely matches the die streets 8. The more narrow die streets may ultimately result in more dies per substrate.

Figure 9:
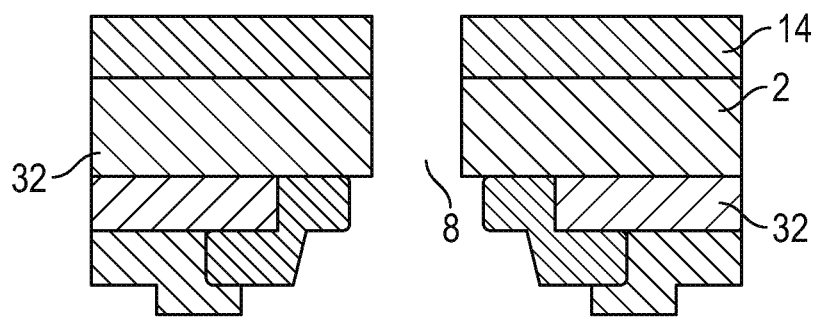
FIG. 9 is a view of the substrate of FIG. 8 singulated into a plurality of die.

Referring to FIG. 9, a view of the substrate of FIG. 8 singulated into a plurality of die is illustrated. In various implementations, and as illustrated by FIG. 9, the method of singulating a plurality of die in a substrate includes removing the photoresist layer 18. In various implementations, the photoresist layer 18 may be removed through, by non-limiting example, a plasma ashing process or with a solvent strip process.

In various implementations, the method of singulating a plurality of die includes singulating a plurality of die 32 through removing the substrate material of the substrate 2 in the die street 8. The substrate material may be removed through plasma etching at the portion of the substrate 2 exposed by the etching. In various implementations, a plasma etch process marketed under the tradename BOSCH® by Robert Bosch GmbH, Stuttgart Germany (the "Bosch process"), may be used to singulate the substrate 2 into a plurality of die 32. In other implementations, other plasma etch processes may be used to singulate the plurality of die 32 from the substrate 2. In various implementations, the die singulated may include a perimeter which may be, by non-limiting example, quadrilateral, rectangular, rounded rectangular, circular, ovate, triangular, pentagonal, hexagonal, heptagonal, octagonal, or any other closed shape. In various implementations, though not illustrated, singulating the plurality of die included in the substrate through plasma etching may include removing a portion of the substrate material of the substrate having a width less than a width of the die street, or groove. In such implementations, the width of the removed portion from plasma etching is less than the width of the die street as plasma die singulation is capable of creating a die street more narrow than a die street created through sawing. In other implementations, and as illustrated by FIG. 9, the width of the portion of the substrate removed through the plasma etch may be the same as the width of the die street by singulating the plurality of die 32 through removing through plasma etch all of the substrate material of the substrate 2 in the die street 8.

In other implementations, the plurality of die may be singulated by removing the substrate material in the die street using either a laser beam or a saw blade. In such implementations, the laser beam or saw blade may result in roughened sidewalls of the die street (or roughened sidewalls of the plurality of die). In such implementations, the method of singulating a plurality of die from the substrate may include remote plasma healing a sidewall of each die (or sidewall of the die street) of the plurality of die. In such implementations, an isotropic plasma etch may be applied to the sidewalls of the die street, or the sidewalls of the plurality of die. The plasma may penetrate/facilitate reaction with the materials of the cracks and/or chips of the sidewalls formed when the plurality of die were singulated from the substrate. As the plasma enters the cracks and/or chips, the damaged portion of the substrate may etch away and result in smoothed, or healed, sidewalls of the die street.

Though not illustrated, in various implementations using a laser beam or saw blade to singulate a plurality of die, the method of singulating a plurality of die from a substrate may include depositing a diffusion barrier layer between the backside metal layer and the substrate. In such implementations, the diffusion barrier layer may serve as an etch stop when the portion of the backside metal layer in the die street is etched. The diffusion barrier layer may also prevent migration of the backside metal layer into the substrate during the etch. In implementations having a diffusion barrier layer, the portion of the diffusion barrier layer in the die street may be removed using a laser beam or a saw blade and may be removed simultaneously with the substrate material in the die street removed by the laser beam or the saw blade. In such implementations, the method of singulating a plurality of die from a substrate may include removing substrate material of the substrate in the die street using any method of removing substrate material disclosed herein.

In the various implementations disclosed herein, by removing the backside metal layer in the die street, the risk of re-deposition of the backside metal material along the sidewalls of each die of the plurality of die is reduced. Further, because various implementations disclosed herein include methods of singulating a plurality of die from a second side, or backside of the substrate, there is no need to flip the substrate over in order to singulate the substrate from the first side, or side having the plurality of die formed thereon. The ability to singulate the die from the backside may reduce damage to the substrate, and especially a thinned substrate, as it requires the substrate to be handled less and may thereby increase the die yield.

Figure 10:
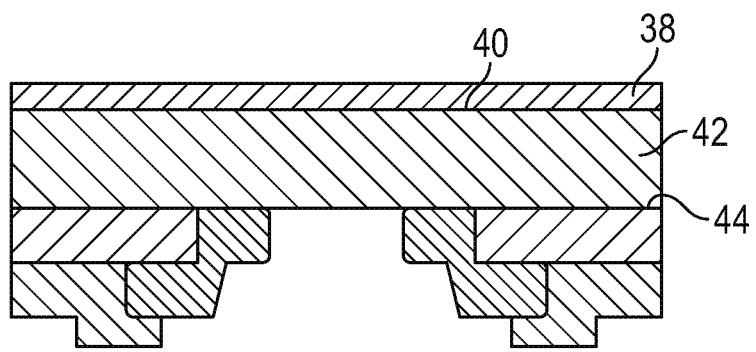
FIG. 10 is a cross-sectional side view of a portion of a substrate with a seed layer coupled thereto.

Referring to FIG. 10, a cross-sectional side view of a portion of a substrate with a seed layer coupled thereto is illustrated. In various implementations, a method of singulating a plurality of die may include forming a seed layer 38 on a second side 40 of a substrate 42 opposite the first side 44 of the substrate. The substrate 42 may be any type of substrate disclosed herein and may be formed and/or thinned using any method disclosed herein. Similarly, a plurality of die, which may include a plurality of layers, may be formed on the first side 44 of the substrate 42 using any method disclosed herein. The plurality of die may be any type of die disclosed herein. In particular implementations, the seed layer 38 may be directly coupled to the second side 40 of the substrate 42. The seed layer 38 may be sprayed onto the substrate 42 or applied to the substrate using, by non-limiting example, electroplating, electroless plating, or another method of metal deposition. In various implementations, the seed layer may entirely coat the second side 40 of the substrate 42. In such implementations, the seed layer may provide electrical continuity throughout the seed layer to facilitate electroplating of a backside metal layer to the seed layer 38, as disclosed later herein. In various implementations, the seed layer 38 may include an adhesion layer which may be directly coupled to the substrate 42. The adhesion layer may include, by non-limiting example, titanium, tungsten, any other metal, any alloys thereof, and any combination thereof. The seed layer 38 may also include a layer over the adhesion layer which may include the same material as the backside metal layer configured to be coupled to the seed layer. In various implementations, the layer of the seed layer 38 over the adhesion layer may include copper, any other metal, any alloy thereof, and any combination thereof. In various implementations, the seed layer may be about 1 μm thick, however, in other implementations the seed layer may be more or less than 1 μm thick.

Figure 11:
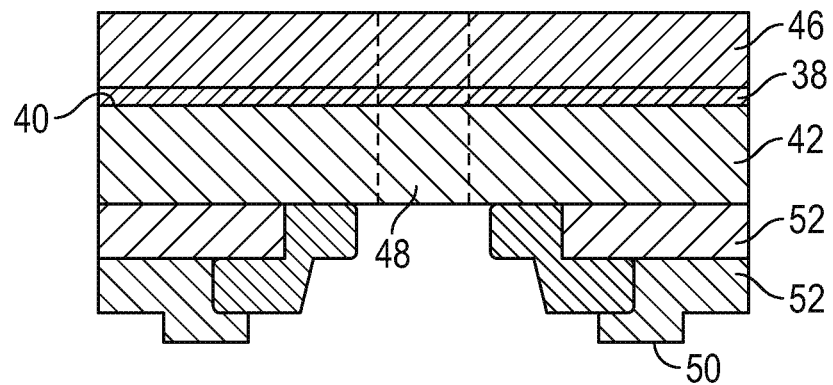
FIG. 11 is a cross-sectional side view of a photoresist layer formed over the seed layer of FIG. 10.

Referring to FIG. 11, a cross-sectional side view of a photoresist layer formed over the seed layer of FIG. 10 is illustrated. In various implementations, the method of singulating a plurality of die from the substrate 42 includes applying a photoresist layer 46 over the seed layer 38. The photoresist layer 46 may be directly coupled to the seed layer 38. The photoresist layer may be made of a positive photoresist or a negative photoresist. In particular implementations, the method includes spraying the photoresist layer 46 over and/or onto the seed layer 38 though other coating techniques like spin coating may be used in various implementations.

Upon applying the photoresist layer 46, the method of singulating the plurality of die in the substrate may include aligning the substrate. In various implementations, the method may include aligning the substrate from the first side (which may be the front side, or bottom side as oriented in FIG. 11) using optics or a camera. In such implementations, the optics or camera may be placed below the substrate and may detect a plurality of alignment features formed on or within the substrate. In various implementations, the alignment features may be formed on or within the die street 48 of the substrate. In implementations having tape coupled to the first side 50 of the plurality of layers 52, the optics or camera may be configured to detect the plurality of alignment features through the tape. In a particular implementation, the substrate may be aligned using an infrared (IR) camera and IR alignment features. In other implementations, the substrate 42 may be aligned from the backside, or second side 40 of the substrate. In such implementations, alignment features may be placed on the photoresist layer 46 covering the substrate 42. Such features may be placed according to corresponding alignment features on the front side of the substrate. In other implementations where the substrate includes a ring around the perimeter after thinning the substrate, the method of aligning the substrate may include placing alignment features in the periphery of the substrate and grinding down the perimeter ring. The substrate may then be aligned from the backside, or second side 40 of the substrate by using the alignment features along the outer edge of the device. Such an alignment method may include using IR spectroscopy.

Figure 12:
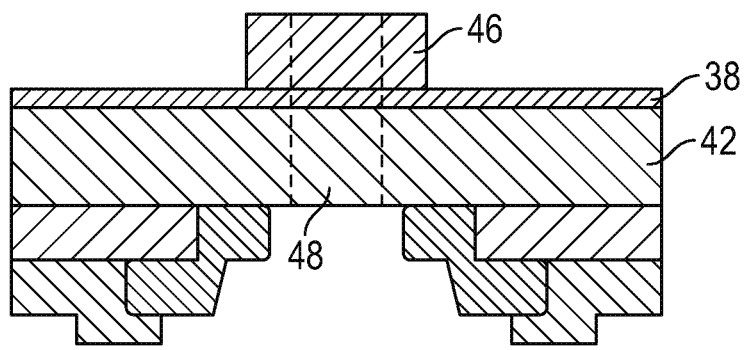
FIG. 12 is a view of the photoresist layer of FIG. 11 after the photoresist layer has been patterned.

Referring to FIG. 12, a view of the photoresist layer of FIG. 11 after the photoresist layer has been patterned is illustrated. In various implementations, the method of singulating a plurality of die of a substrate 42 includes patterning the photoresist layer 46 along the die street 48 of the substrate 42 resulting in the photoresist layer covering the die streets but not covering the rest of the seed layer 38 between the die streets (or above the rest of the die). In various implementations, patterning the photoresist layer 46 may include exposing a negative photoresist layer along the die streets 48 of the substrate 42. In other implementations, patterning the photoresist layer 46 may include exposing the portions not along a die street of a positive photoresist layer. In various implementations, a mask with a pattern corresponding to all of the die streets 48 may be used in exposing the positive photoresist layer. In other implementations, multiple masks may be used to expose the positive photoresist layer along the die streets 48 or along the portions of the photoresist layer not over the die streets 48 using stepping or scanning operations.

In particular implementations may include exposing the entirely photoresist layer using a mask having a plurality of parallel slits therein. After exposing the photoresist layer using the mask in a first direction, the mask may then be rotated 90 degrees (or more or less than 90 degrees) and the photoresist layer may be exposed using the mask in a second direction. Such an implementation may be used when the die singulated are rectangular or have a quadrilateral shape. In a similar implementation, the mask having the plurality of parallel slits may be rotated a second time and the photoresist layer may be exposed a third time. Such an implementation may be used when the die singulated are triangular or another closed polygonal shape where more than two masks may be employed and more than a single exposure step may be used to expose the photoresist. Patterning the photoresist layer 46 also includes developing the photoresist layer 46 to remove the portions of the photoresist layer not included in the die streets 48. Because the photoresist layer is exposed and developed, the patterned photoresist layer may correspond to the die streets with a high degree of accuracy. In turn, this may allow for accurate deposition of the backside metal layer, as disclosed later herein, and may also allow for more narrow die streets, resulting in more die per substrate. In other implementations, and as illustrated by FIG. 12, the photoresist layer 46 is patterned wider than the die street 48.

Figure 13:
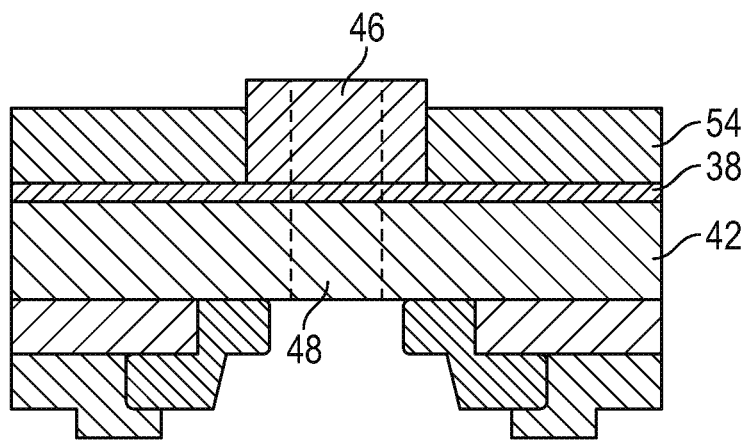
FIG. 13 is a cross-sectional side view of a backside metal layer formed over the seed layer of FIG. 12.

Referring to FIG. 13, a cross-sectional side view of a backside metal layer formed over the seed layer of FIG. 12 is illustrated. In various implementations, the method of singulating a plurality of die includes forming a backside metal layer 54 over the seed layer 38 and between the opening in the photoresist layer. In particular implementations, the method may include electroplating or electroless plating the backside metal layer 54 over the seed layer. The backside metal layer may include copper, a copper alloy, any other metal, or any combination thereof. The backside metal layer 54 may be 10 μm thick, 15 μm thick, more than 10 μm thick, or less than 15 μm thick.

Figure 14:
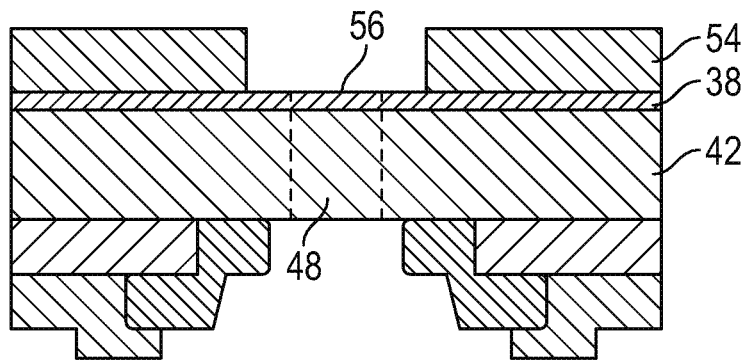
FIG. 14 is a view of the substrate and seed layer of FIG. 13 with the photoresist layer removed.

Referring to FIG. 14, a view of the substrate and seed layer of FIG. 13 with the photoresist layer removed is illustrated. The method of singulating a plurality of die included in a substrate includes removing the photoresist layer covering the die streets, as illustrated by FIG. 13. The method may include removing the photoresist layer 46 through etching, ashing, or solvent stripping. The seed layer 38 may prevent damage to the substrate 42 during removal of the photoresist layer 46. Upon removing the photoresist layer 46, the portion 56 of the seed layer 38 in the die street 48 may be exposed.

Figure 15:
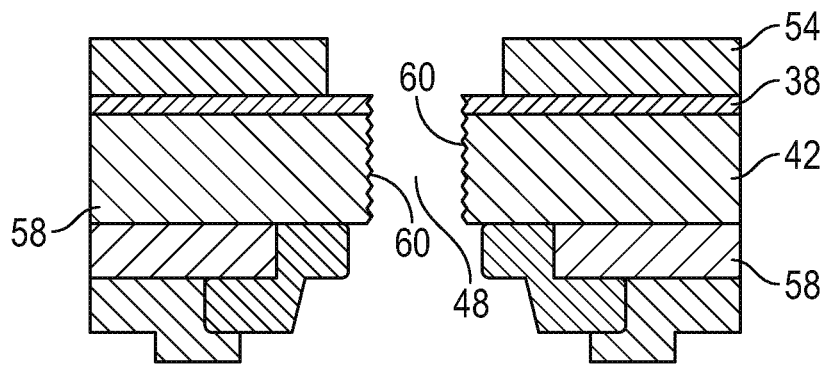
FIG. 15 is a view of the substrate of FIG. 14 singulated into a plurality of die.
Figure 16:
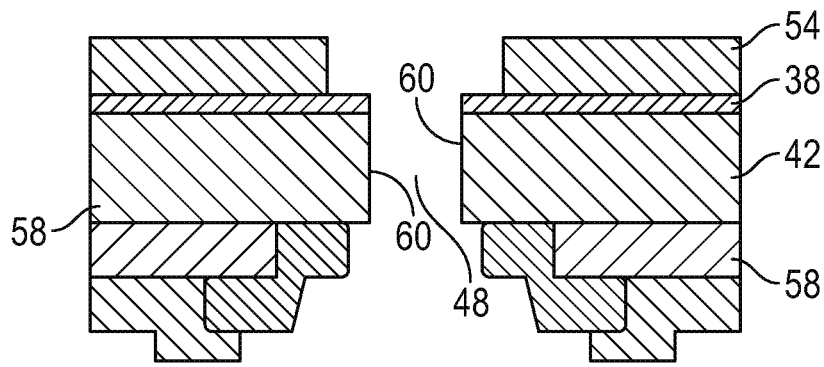
FIG. 16 is a view of the plurality of die of FIG. 15 having smooth sidewalls.

Referring to FIG. 15, a view of the substrate of FIG. 14 singulated into a plurality of die is illustrated. In various implementations, the die of the plurality of die may include a quadrilateral perimeter or a triangular perimeter or other perimeter shape disclosed herein. The method of singulating a plurality of die 58 in the substrate 42 includes removing substrate material in the die street 48 and removing the seed layer material in the die street. In various implementations, the substrate material in the die street 48 and the seed layer material 38 in the die street may be removed using either a laser beam or a saw blade. In such implementations, the seed layer material in the die street 48 may be simultaneously removed with the substrate material in the die street as the laser ablation or sawing used to clear the seed metal material from the die street may also clear the substrate material from the die street. In implementations using a laser beam or saw blade to singulate the plurality of die 58, the laser beam or saw blade may result in roughened sidewalls 60 of the die street 48 or of the plurality of die 58. In such implementations, the method of singulating a plurality of die 52 from the substrate may include remote plasma healing a sidewall of each die (or sidewall 60 of the die street 48) of the plurality of die 58. Referring to FIG. 16 a view of the plurality of die of FIG. 15 having smooth sidewalls is illustrated. In various implementations, the method of singulating the plurality of die 58 may include removing damage from a sidewall 60 of the die street 48 through remote plasma healing. In such implementations, an isotropic plasma etch may be applied to the sidewalls 60 of the die street 48. The plasma may penetrate/facilitate reaction with the materials of the cracks and/or chips of the sidewalls 60 formed when the plurality of die 58 were singulated from the substrate 42. As the plasma enters the cracks and/or chips, the damaged portion of the substrate 42 may etch away and result in smoothed, or healed, sidewalls 60 of the die street 48, as illustrated by FIG. 16.

In the various implementations disclosed herein, by removing the backside metal layer in the die street, the risk of re-deposition of the backside metal material along the sidewalls of each die of the plurality of die is reduced. Though the seed metal layer may be removed at the same time the substrate material is removed from the die street, and in turn, the plurality of die are singulated, because the seed metal layer is extremely thin as compared to the thickness of the backside metal layer, the risk of re-deposition is still reduced. Further, because various implementations disclosed herein include methods of singulating a plurality of die from a second side, or backside of the substrate, there is no need to flip the substrate over in order to singulate the substrate from the first side, or side having the plurality of die formed thereon. The ability to singulate the die from the backside may reduce damage to the substrate, and especially a thinned substrate, as it requires the substrate to be handled less.

Figure 17:
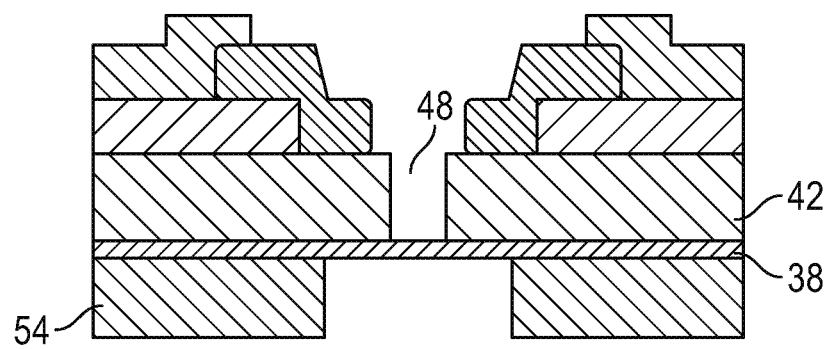
FIG. 17 is a view of the substrate of FIG. 14 in a flipped orientation and with substrate material in the die street removed.
Figure 18:
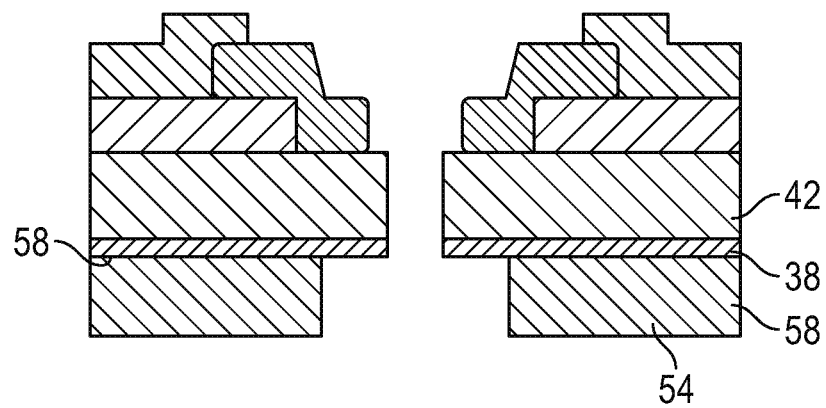
FIG. 18 is a view of the substrate of FIG. 14 singulated into a plurality of die.

Referring to FIG. 17, a view of the substrate of FIG. 14 in a flipped orientation and with substrate material in the die street removed is illustrated. In another implementation, rather than singulating the plurality of die as illustrated by FIG. 15, the method of singulating a plurality of die may include flipping the substrate 180 degrees and removing the substrate material in the die street 48. In various implementations, the substrate material may be removed through plasma etching, including any plasma etching process disclosed herein. Referring to FIG. 18, a view of the substrate of FIG. 14 singulated into a plurality of die is illustrated. In various implementations, the method of singulating a plurality of die 58 may include jet ablating the seed metal material in the die street 48. In the implementation illustrated by FIGS. 17-18, by removing the backside metal layer in the die street and by removing the substrate material in the die street through plasma etching prior to removing the seed layer material in the die street 48, the risk of re-deposition of the backside metal material along the sidewalls of each die of the plurality of die may be removed.

In places where the description above refers to particular implementations of die singulation systems and related methods and implementing components, sub-components, methods and sub-methods, it should be readily apparent that a number of modifications may be made without departing from the spirit thereof and that these implementations, implementing components, sub-components, methods and sub-methods may be applied to other die singulation systems and related methods.

What is claimed is:

1. A method of aligning a silicon carbide substrate, the method comprising:
   forming a plurality of die on a first side of the silicon carbide substrate;
   forming an edge ring on a second side of the silicon carbide substrate;
   forming a backside metal layer on the second side of the silicon carbide substrate;
   applying a photoresist layer over the backside metal layer; and
   aligning the silicon carbide substrate from the second side of the silicon carbide substrate using a plurality of alignment features comprised one of in the edge ring or on the photoresist layer.

2. The method of claim 1, further comprising:
   patterning the photoresist layer along a die street of the silicon carbide substrate;
   etching through the backside metal layer located in the die street of the silicon carbide substrate, wherein the silicon carbide substrate is exposed through the etching; and
   singulating the plurality of die comprised in the silicon substrate through removing substrate material in the die street.

3. The method of claim 1, wherein the plurality of alignment features are formed on the photoresist layer.

4. The method of claim 1, wherein the silicon carbide substrate is thinned to 75 micrometers thick.

5. The method of claim 1, wherein the backside metal layer is 10 micrometers thick.

6. The method of claim 1, further comprising thinning the edge ring prior to aligning the silicon carbide substrate.

7. The method of claim 1, wherein removing substrate material in a die street further comprises plasma etching.

8. A method of aligning a substrate, the method comprising:
   forming a plurality of power semiconductor die on a first side of the substrate;
   forming an edge ring on a second side of the substrate;
   forming a backside metal layer on the second side of the substrate;
   applying a photoresist layer over the backside metal layer; and
   aligning the substrate from the second side of the substrate using a plurality of alignment features comprised one of in the edge ring or on the photoresist layer.

9. The method of claim 8, further comprising forming a seed layer over the second side of the substrate.

10. The method of claim 8, wherein the plurality of alignment features are formed on the photoresist layer.

11. The method of claim 8, wherein the plurality of power semiconductor die comprise one of an IGBT, a MOSFET, or both the IGBT and the MOSFET.

12. The method of claim 8, wherein the backside metal layer is 10 micrometers thick.

13. The method of claim 8, further comprising thinning the edge ring prior to aligning the substrate.

14. A method of singulating a plurality of die comprised in a substrate, the method comprising:
   forming a plurality of die on a first side of the substrate;
   forming a seed layer on a second side of the substrate opposite the first side of the substrate;
   applying a photoresist layer over the seed layer;
   aligning the substrate from the second side of the substrate using a plurality of alignment features one of in a periphery of the substrate or on the photoresist layer;
   patterning the photoresist layer;
   forming a backside metal layer over the seed layer;
   removing the photoresist layer;
   singulating the plurality of die comprised in the substrate through removing substrate material in a die street and through removing the seed layer in the die street; and
   remote plasma healing a sidewall of each singulated die.

15. The method of claim 14, wherein the plurality of alignment features are formed on the photoresist layer.

16. The method of claim 14, wherein the substrate is a silicon carbide substrate.

17. The method of claim 14, wherein the backside metal layer is 10 micrometers thick.

18. The method of claim 14, wherein the substrate is thinned to less than 50 microns thick.

19. The method of claim 14, wherein removing substrate material in the die street further comprises plasma etching.

20. The method of claim 14, wherein the plurality of die comprise a plurality of power semiconductor die.

\* \* \* \* \*